United States Patent
Bhushan et al.

(10) Patent No.: US 12,266,630 B2
(45) Date of Patent: *Apr. 1, 2025

(54) BOND PAD CONNECTION LAYOUT

(71) Applicant: Lodestar Licensing Group LLC, Evanston, IL (US)

(72) Inventors: Bharat Bhushan, Taichung (TW); Pratap Murali, Meridian, ID (US); Raj K. Bansal, Boise, ID (US); David A. Daycock, Singapore (SG)

(*) Notice: Subject to any disclaimer, the term of this patent is extended or adjusted under 35 U.S.C. 154(b) by 0 days.

This patent is subject to a terminal disclaimer.

(21) Appl. No.: 18/405,875

(22) Filed: Jan. 5, 2024

(65) Prior Publication Data
US 2024/0145425 A1    May 2, 2024

Related U.S. Application Data

(63) Continuation of application No. 17/956,797, filed on Sep. 29, 2022, now Pat. No. 11,876,068, which is a continuation of application No. 17/103,834, filed on Nov. 24, 2020, now Pat. No. 11,502,053.

(51) Int. Cl.
*H01L 23/00* (2006.01)
*H01L 25/18* (2023.01)

(52) U.S. Cl.
CPC .............. *H01L 24/49* (2013.01); *H01L 24/06* (2013.01); *H01L 25/18* (2013.01); *H01L 2924/15165* (2013.01)

(58) Field of Classification Search
CPC .......... H01L 24/49; H01L 24/06; H01L 25/18
See application file for complete search history.

(56) References Cited

U.S. PATENT DOCUMENTS

| | | | |
|---|---|---|---|
| 6,114,740 A | 9/2000 | Takimoto et al. | |
| 6,433,374 B1 | 8/2002 | Fukunaga et al. | |
| 10,020,074 B1 | 7/2018 | Jeong | |
| 10,312,219 B2* | 6/2019 | Ng | H01L 25/0652 |
| 10,600,781 B1 | 3/2020 | Xiao et al. | |
| 11,159,166 B2 | 10/2021 | Lee et al. | |

(Continued)

FOREIGN PATENT DOCUMENTS

| | | |
|---|---|---|
| KR | 10-2008-0111329 A | 12/2008 |
| KR | 10-2016-0074925 A | 6/2016 |

OTHER PUBLICATIONS

International Application No. PCT/US2021/058124—International Search Report and Written Opinion, mailed Feb. 17, 2022, 11 pages.

*Primary Examiner* — Khaja Ahmad

(57) ABSTRACT

A memory device includes a package substrate and at least one stack of a plurality of semiconductor dies disposed on the package substrate. The plurality of semiconductor dies can be stacked in a shingled configuration. Each semiconductor die includes a plurality of slits disposed in a first direction. An offset direction defining the shingled arrangement is in-line with the first direction. Each semiconductor die can include a die substrate and a plurality of memory planes disposed on the die substrate with each memory plane having a memory cell array. Each slit can divide and separate each memory plane into at least one of logic blocks or sub-logic blocks. The semiconductor die can include a plurality of bond pads linearly aligned in a second direction that is perpendicular to the first direction.

20 Claims, 6 Drawing Sheets

(56) References Cited

U.S. PATENT DOCUMENTS

| | | |
|---|---|---|
| 2008/0159042 A1 | 7/2008 | Bertin et al. |
| 2010/0320598 A1 | 12/2010 | Murayama et al. |
| 2016/0181260 A1 | 6/2016 | Lee |
| 2017/0123946 A1 | 5/2017 | Wu et al. |
| 2017/0125378 A1* | 5/2017 | Park .................. H01L 24/48 |
| 2017/0309634 A1 | 10/2017 | Noguchi et al. |
| 2019/0179701 A1 | 6/2019 | Lee |
| 2019/0244930 A1* | 8/2019 | Ng .................... H01L 24/49 |
| 2020/0098748 A1 | 3/2020 | Xiao et al. |
| 2020/0192755 A1 | 6/2020 | Jeong et al. |
| 2020/0265912 A1 | 8/2020 | Wieduwilt et al. |
| 2021/0111152 A1 | 4/2021 | Park et al. |
| 2021/0217760 A1* | 7/2021 | Yang .................. H01L 23/5226 |
| 2022/0085056 A1* | 3/2022 | Zhang ................ H10B 43/10 |
| 2022/0164251 A1 | 5/2022 | He et al. |
| 2022/0165701 A1 | 5/2022 | Bhushan et al. |

\* cited by examiner

BOND PAD CONNECTION LAYOUT

CROSS-REFERENCE TO RELATED APPLICATION(S)

This application is a continuation of U.S. patent application Ser. No. 17/956,797, filed Sep. 29, 2022, which is a continuation of U.S. patent application Ser. No. 17/103,834, filed Nov. 24, 2020, each of which is incorporated herein by reference in its entirety.

TECHNICAL FIELD

The present disclosure generally relates to semiconductor devices, and more particularly relates to semiconductor device assemblies including bond pad connection layout for multiple shingled stacks of semiconductor dies.

BACKGROUND

Semiconductor devices, such as memory devices, are widely used to store information related to various electronic devices such as computers, wireless communication devices, cameras, digital displays, and the like. Memory devices are frequently provided as internal, semiconductor, integrated circuits and/or external removable devices in computers or other electronic devices. There are many different types of memory, including volatile and non-volatile memory. Volatile memory, including random-access memory (RAM), static random access memory (SRAM), dynamic random access memory (DRAM), and synchronous dynamic random access memory (SDRAM), among others, may require a source of applied power to maintain its data. Non-volatile memory, by contrast, can retain its stored data even when not externally powered. Non-volatile memory is available in a wide variety of technologies, including flash memory (e.g., NAND and NOR) phase change memory (PCM), ferroelectric random access memory (FeRAM), resistive random access memory (RRAM), and magnetic random access memory (MRAM), among others. Improving memory devices, generally, may include increasing memory cell density, increasing read/write speeds or otherwise reducing operational latency, increasing reliability, increasing data retention, reducing power consumption, or reducing manufacturing costs, among other metrics. In addition, to provide additional capacity, more than one semiconductor die can be added to a memory device.

A memory device typically includes one or more semiconductor dies mounted on a substrate and encased in a plastic protective covering or covered by a heat-conducting lid (also referred to herein as a "package"). Each semiconductor die can include active circuits (e.g., providing functional features such as memory cells, processor circuits, and/or imager devices) and/or passive circuits (e.g., capacitors, resistors, etc.) as well as contact pads (also referred to herein as "bond pads") electrically connected to the circuits. The bond pads can be electrically connected to terminals outside the protective covering via corresponding bondfingers to allow the semiconductor die to be connected to higher level circuitry.

One approach to mounting multiple semiconductor dies in a single package involves stacking the semiconductor dies over a substrate. FIGS. 1A and 1B illustrate simplified block diagrams of a package for a memory device 10 with semiconductor dies A and B that are stacked in a shingled arrangement where semiconductor die A is stacked on top of semiconductor die B in an offset pattern similar to that of shingles on a roof. The semiconductor dies A and B have a substrate 12 and the components (e.g., memory cell arrays and controllers) are disposed in a layer 14 on top of the die substrate 12. Each semiconductor die A, B is configured such that the respective bond pads are disposed parallel to the slits 20 of the planes. Thus, when stacked, the semiconductor dies A and B are offset in the bitline direction to facilitate the electrical connections between the dies and between the dies and the package substrate. That is, each semiconductor die is offset in the bitline direction from the semiconductor die below so that the exposed bond pads of each semiconductor die A and B can be bonded (e.g., with a wirebond) to each other and/or to the corresponding bondfingers on the package substrate. However, in related art memory devices, the shingling arrangement causes stresses due to bending forces in the semiconductor dies during the manufacturing process. Because of the slits 20, the stresses can cause failure of the semiconductor dies and thus the memory device 10. To keep the failure rate of the memory device down so as to meet industry standards (e.g., a standard in which 99.5% of the semiconductor dies must pass a 3-point and/or 4-point bending test at 200 MPa), the thickness of the substrate of the semiconductor die is typically about 50 µm or greater. To increase the amount of memory in the memory device, additional semiconductor dies can be added to the package. However, the semiconductor dies will need to be thinner in order to keep the size of the package the same. It is believed that, with current packaging techniques, semiconductor dies cannot be made thinner and still meet industry standards such as having a 99.5% success rate when performing the 3-point and/or 4-point bending test at 200 MPa.

DETAILED DESCRIPTION

As discussed in greater detail below, the technology disclosed herein relates to memory devices and the packaging of semiconductor dies in a memory device. A person skilled in the art, however, will understand that the technology may have additional embodiments and that the technology may be practiced without several of the details of the embodiments described below with reference to FIGS. 2A to 4E.

Exemplary embodiments of the present technology are directed to memory devices having stacked semiconductor dies in a shingled arrangement. In some exemplary embodiments, a memory device can include a package substrate and at least one stack of semiconductor dies disposed on the package substrate. The plurality of semiconductor dies can be stacked in a shingled configuration. Each semiconductor die can include a plurality of slits disposed in a first direction. An offset direction defining the shingled arrangement can be in-line with the first direction. In some embodiments, each semiconductor die can include a die substrate and a plurality of memory planes disposed on the die substrate. Each slit can divide and separate each memory plane into at least one of logic blocks or sub-logic blocks. In some embodiments, the semiconductor die can include a plurality of bond pads linearly aligned in a second direction that is perpendicular to the first direction. In some embodiments, two or more shingled stacks of semiconductor dies can be included in a memory device. In some embodiments, a thickness of the substrate of one or more of the semiconductor dies can be 40 μm or less, in some cases, in a range of 20 μm to 40 μm, and still in other cases 30 μm to 40 μm. In some embodiments, the semiconductor die, which has a thickness of 40 μm or less, meets an industry standard 3-point and/or 4-point bending test at 200 MPa with a success rate of 95.5% or more.

Figure 2A:
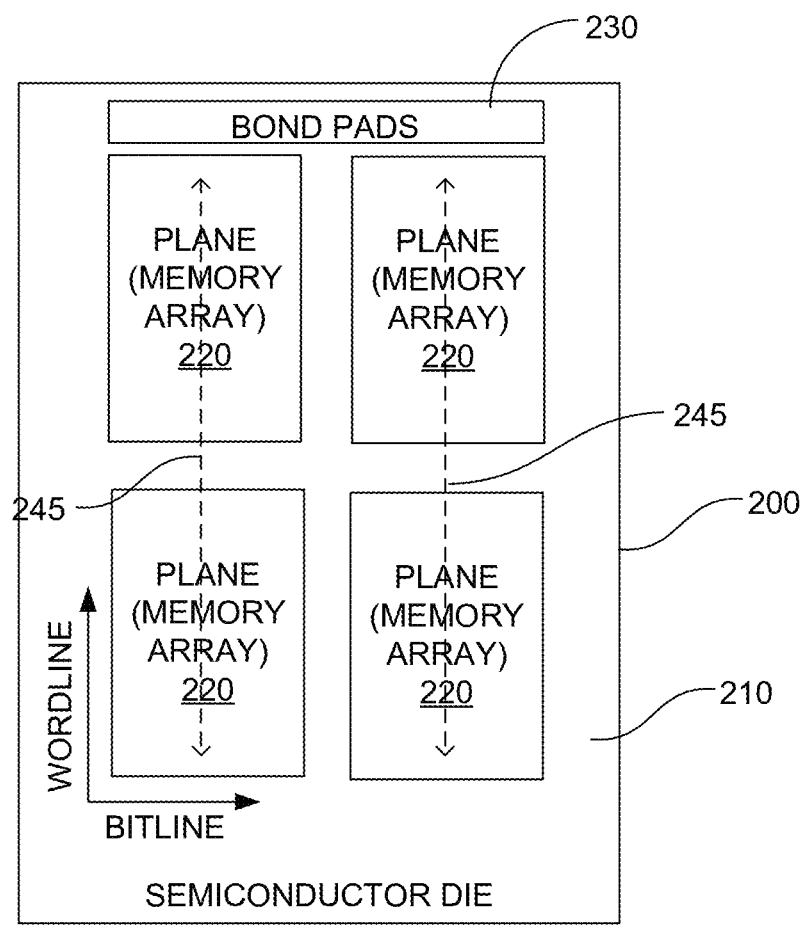
FIG. 2A is a block diagram of an embodiment of a semiconductor die in accordance with the present disclosure.

FIG. 2A is a simplified top view of a semiconductor die in accordance with an embodiment of the present technology that can be included in a memory device having one or more shingled stacks of semiconductor dies. The semiconductor die 200 includes a substrate 210, one or more planes 220 incorporating one or more memory cell arrays (not shown), and a bond pad connection section 230. The planes 220 of the semiconductor die include slits that are perpendicular to the bitlines and parallel to the wordlines of the planes 220. The slits separate the planes 220 into logical blocks and/or logical sub-blocks, as discussed below. The bond pad connection section 230 includes one or more bond pads 232 (see FIG. 3A) for electrically connecting the semiconductor dies 200 to, for example, each other and/or to bondfingers on a substrate of a memory device. The bond pads in the bond pad connection section 230 can be linearly aligned such that the bond pad connection section 230 is oriented perpendicular to the slits 245 (can also be oriented parallel to the bitlines and/or perpendicular to the wordlines of the planes 220). Those skilled in the art understand the memory cell array configuration in a semiconductor die, including the routing of connections to the bitlines, the wordlines, and the bond pads. Thus, for brevity, the routing and connection details are not discussed except as necessary to understand the present technology.

Figure 2B:
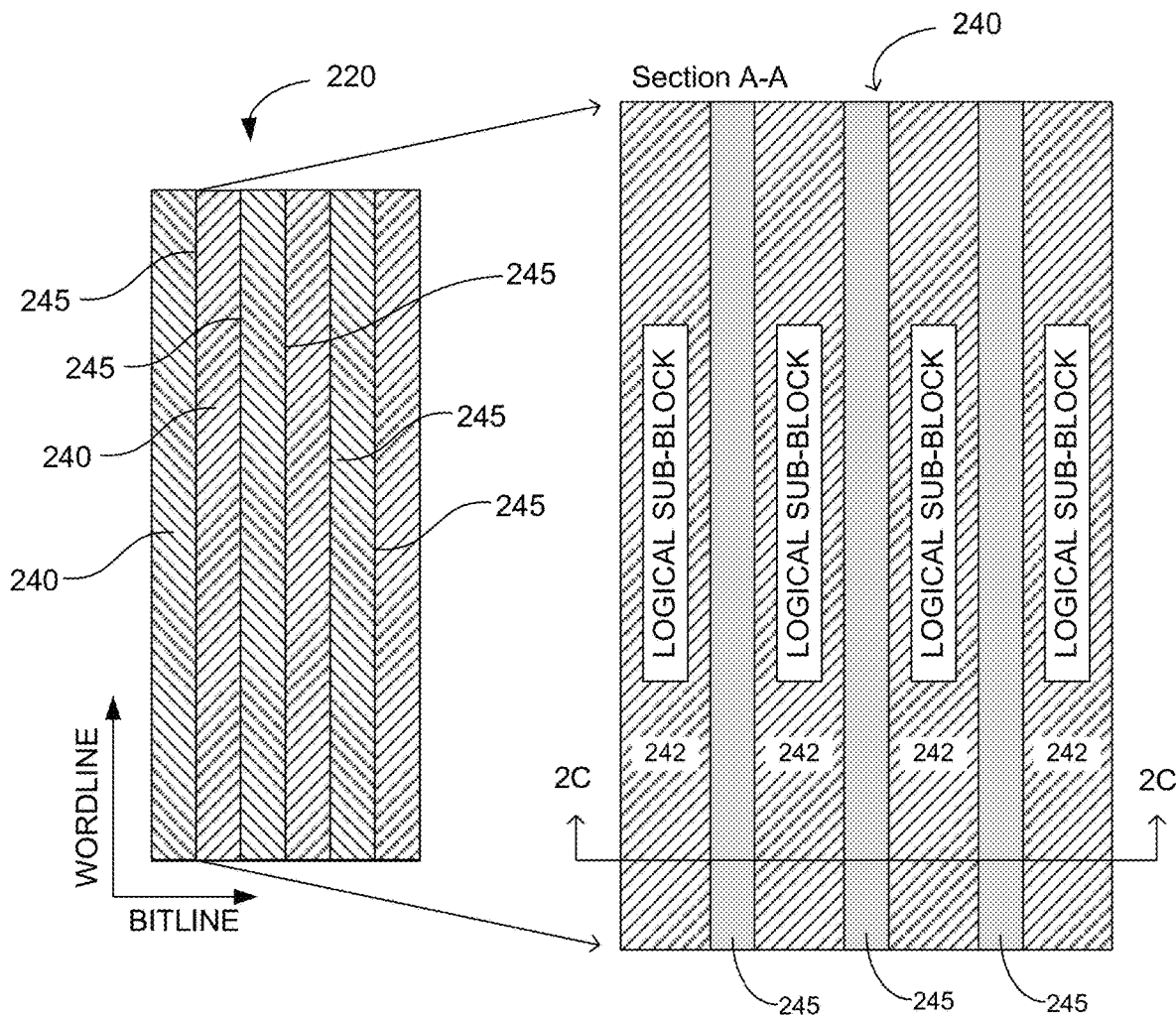
FIG. 2B is block diagram of a plane of the semiconductor die of FIG. 2A.
Figure 2C:
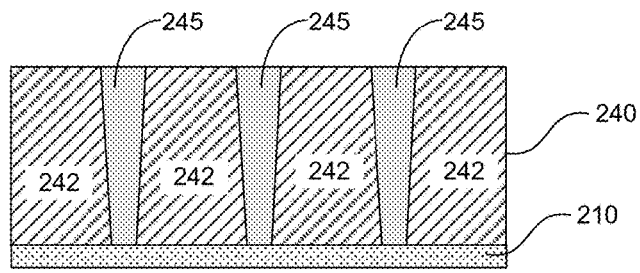
FIG. 2C is a block diagram of a front cross-sectional view of the plane of FIG. 2B.

FIG. 2B shows a more detailed top view of a plane 220. As seen in FIG. 2B, each plane 220 can include one or more logical blocks 240. That is, the memory cell arrays in each plane 220 can be segmented into one or more smaller logical blocks of memory cell arrays. In addition, as seen in the enlarged section A-A, the memory cell arrays in one or more of the logical blocks 240 can be further segmented into one or more logical sub-blocks 242. The semiconductor die 200 can include slits 245 that separate and define each of the logical blocks 240 and/or logical sub-blocks 242. As seen in FIG. 2C, which shows a side cross-sectional view of the logic block 240 of FIG. 2B, the slits 245 can extend from the top surface of the semiconductor die 200 to the substrate 210. The slits 245 can be straight or slightly tapered depending on the manufacturing process. The slits 245 can be composed of an appropriate dielectric material in order to electrically isolate (e.g., for noise reduction) the logical blocks 240 and/or logical sub-blocks 242 from each other.

Figure 3A:
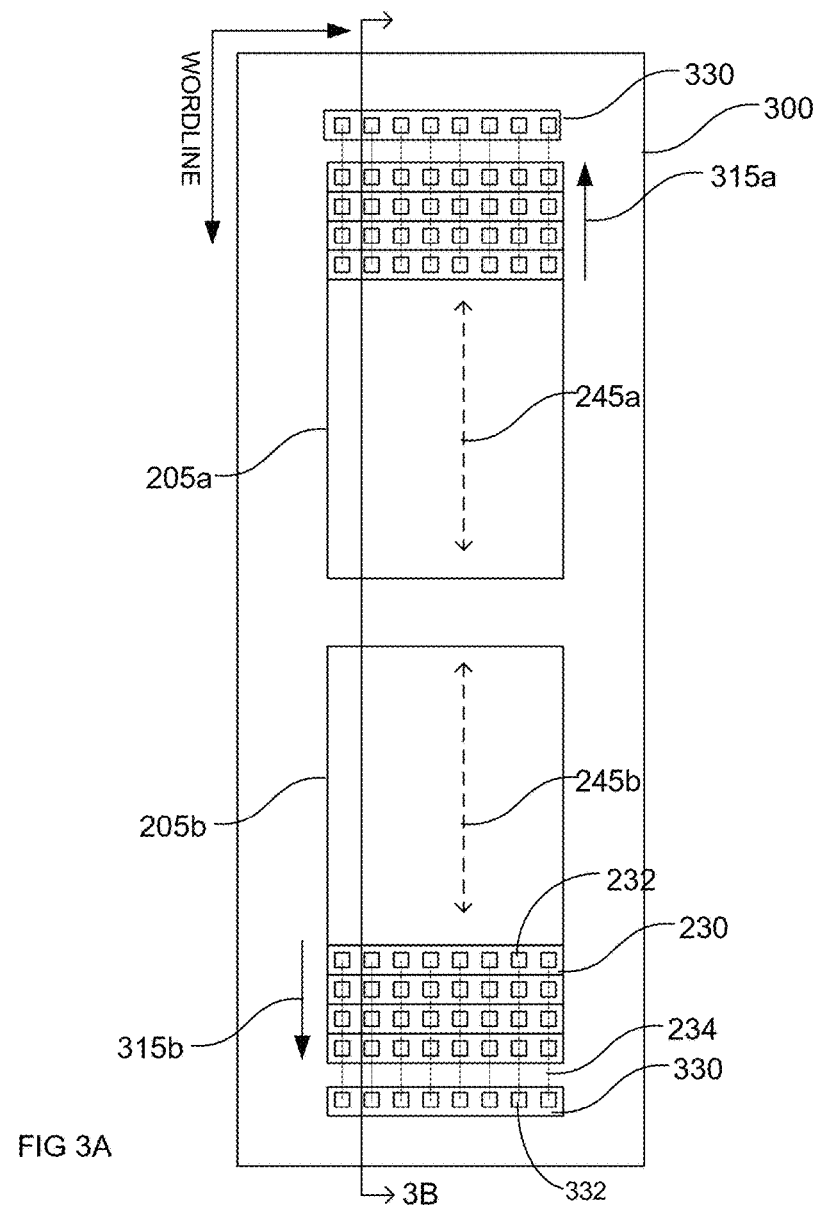
FIG. 3A is a block diagram showing a 3D shingled arrangement of a portion of a memory device package using the semiconductor dies of FIG. 2A.

FIG. 3A illustrates a portion of a memory device 300 in accordance with an embodiment of the present disclosure. The memory device 300 can include one or more stacks of semiconductor dies 200. For example, FIG. 3A illustrates two stacks 205a and 205b but other exemplary embodiments can have one stack or more than two stacks. The bond pad connection section 230 in each of the stacked semiconductor dies 200 can be arranged near an edge of the respective semiconductor die 200. The bond pad connection section 230 can include a plurality of bond pads 232 that are arranged in a linear orientation. The bond pad connection section 230 and thus the linearly aligned bond pads 232 can be oriented perpendicular to the slits 245 (for clarity, shown collectively as dotted lines 245a, 245b). In some embodiments of the present disclosure, the offset directions 315a, 315b of the shingled stack pattern of the stacks 205a, b are in-line with or parallel to the direction of the slits 245. "Offset direction" as used herein is the direction a lower semiconductor die is offset from an upper semiconductor die in a stack.

Figure 3B:
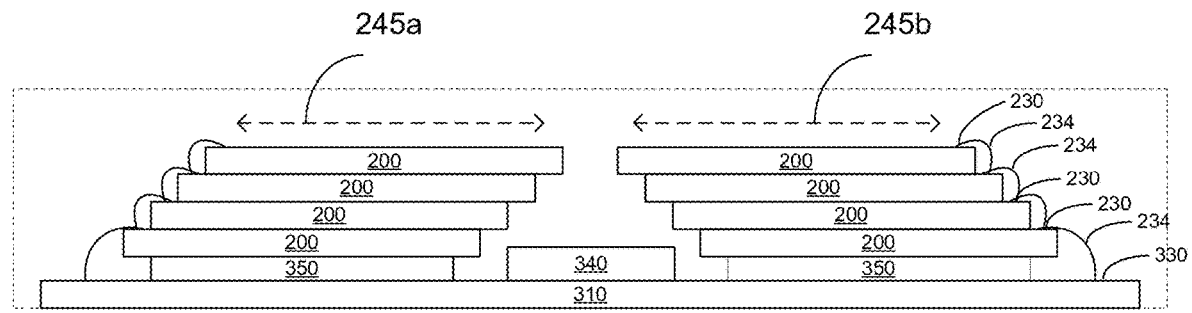
FIG. 3B is a side cross-sectional view of the semiconductor package of FIG. 3A.

As seen in FIGS. 3A and 3B, each upper semiconductor die 200 is offset from the lower semiconductor die 200 by an amount sufficient to allow access to the bond pad connector section 230 and more specifically to the bond pads 232 of the lower semiconductor die 200. The bond pads 232 are connected to the appropriate bond pads in the other semiconductor dies 200 with wirebonds 234. The wirebonds 234 can also connect the bond pads 232 to the appropriate bondfingers 332 in wirefinger contact section 330. The bondfingers 332 can be connected to corresponding external contacts of the memory device 300 (e.g., solder balls (not shown)). As seen in FIG. 3B, the shingled pattern allows for a compact configuration of the semiconductor dies 200 while still allowing access to the bond pads 232. In addition, due to the staircase-type configuration of the opposing stacks 205a, 205b, other components such as, for example, controller 340 can be arranged under the stacks 205a,b on the memory device or package substrate 310. In some embodiments, the bottommost semiconductor die 200 can be mounted on the substrate 310. However, in other embodiments, one or more stacks 205a,b can be offset from the substrate 310 by a spacer 350 that can be composed of, for example, silicon-oxide.

As discussed above, the offset directions 315a,b of the respective stacks 205a,b are in-line or parallel with the slits 245, and the bond pads 232 of the semiconductor dies 200 are arranged perpendicular to the slits 245. In contrast, in related art systems, the offset direction of the shingled stacks is perpendicular to the slits that separate and define the logic blocks, and the bond pad orientation of the related art memory devices is parallel to the slits. Because the arrangement of the bond pads is parallel to the slits (or offset directions of the semiconductor dies are perpendicular to the slits) in related art systems, the bending stresses at the slits in related art systems can be high. Thus, the semiconductor die substrate must be thick enough to compensate for the stresses. For example, because the wire-bounding process can produce high external stresses during manufacture, the substrate thickness can be 50 μm or greater in related art semiconductor dies. However, because the arrangement of the bond pads is perpendicular to the slits (and offset directions of the semiconductor dies parallel to the slits) in exemplary embodiments of the present disclosure, the bending stresses at the slits are lower and the semiconductor die substrate can be thinner (e.g., less than 50 μm and, in some cases, 40 μm or less e.g., in a range of 20 μm to 40 μm, 30 μm to 40 μm, etc.). Because the semiconductor dies can be thinner in exemplary embodiments of the present disclosure, the stacks of memory devices can have more semiconductor dies (e.g., eight dies or more and, in some cases, sixteen dies or more) and/or the memory device package size can be smaller than similarly configured related art memory devices.

Figure 1A:
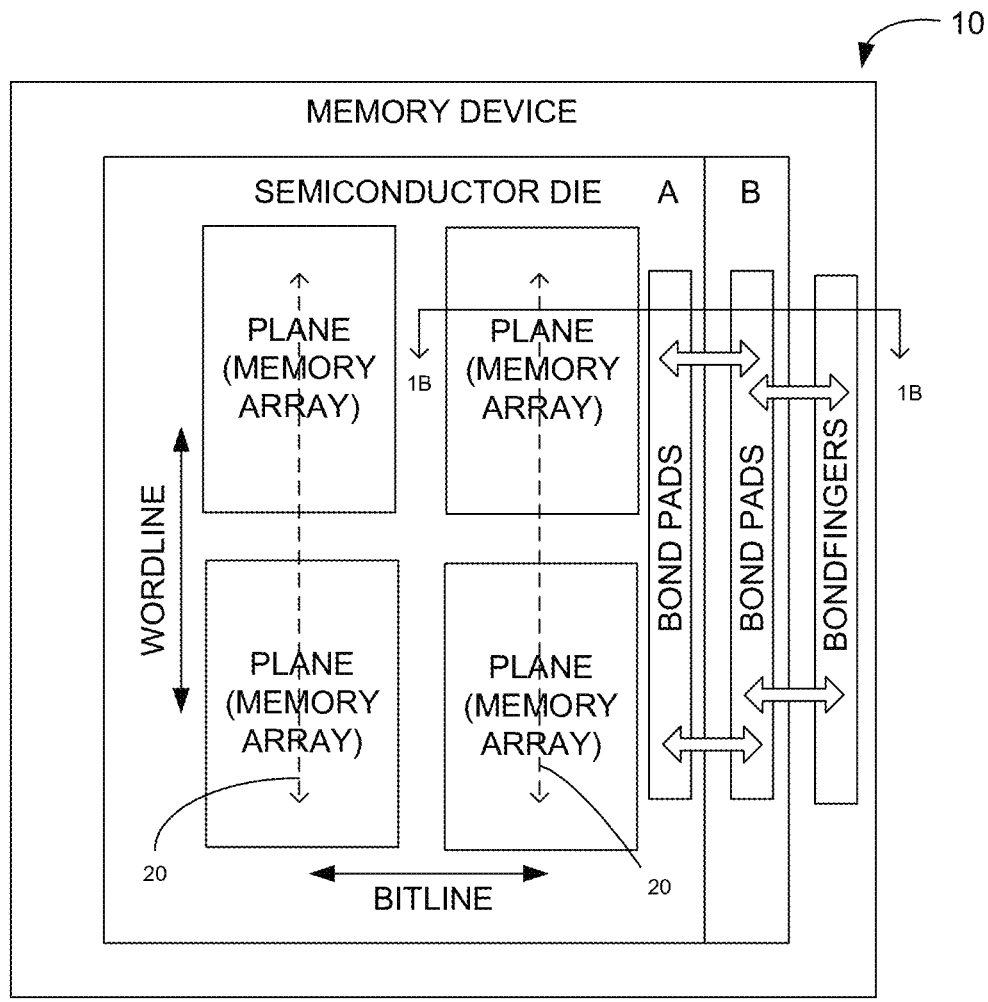
FIGS. 1A and 1B are top and side view block diagrams of a related art memory device package with stacked semiconductor dies.
Figure 1B:
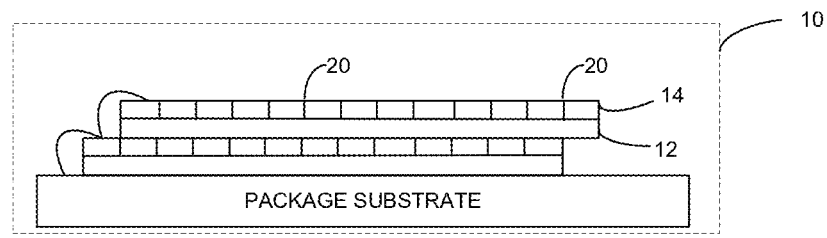
Figure 4A:
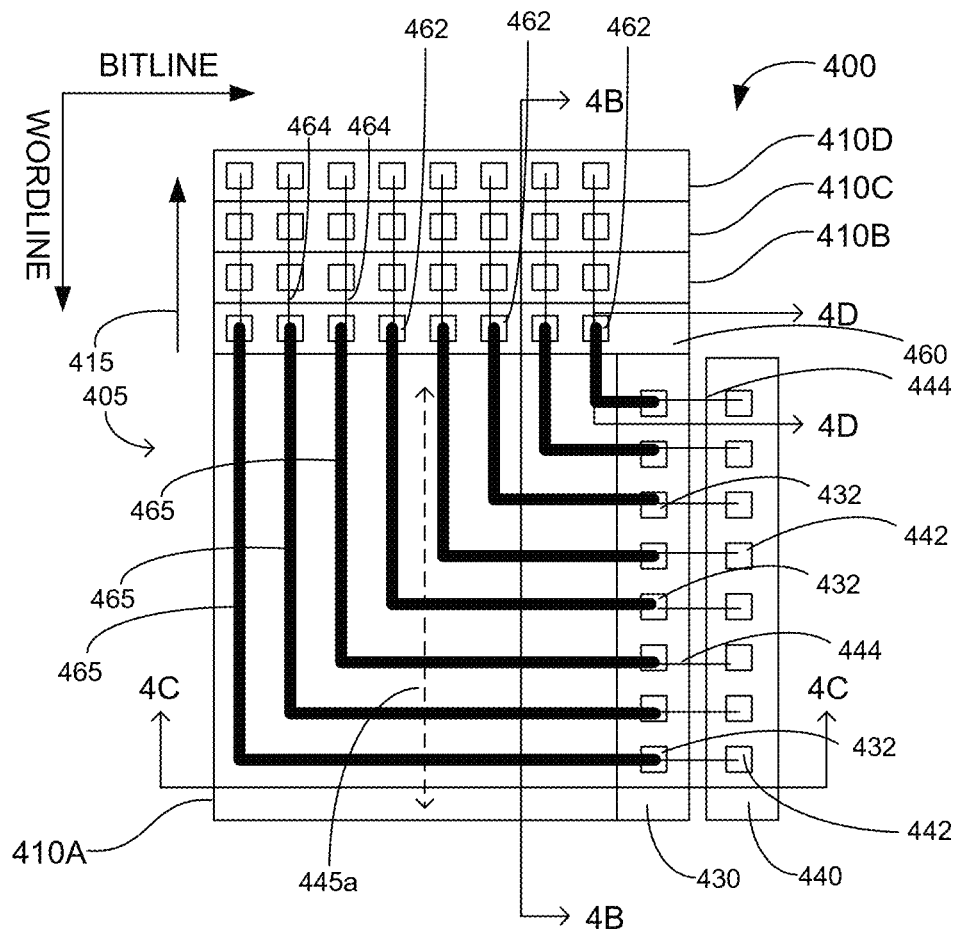
FIG. 4A is a block diagram of a portion of another embodiment of a memory device package using a semiconductor die in accordance with the present disclosure.

FIG. 4A illustrates a portion of another embodiment of a memory device using semiconductor dies in accordance with the present technology. As seen in FIG. 4A, in the memory device 400, at least the topmost semiconductor die 410A of the stack 405 can be configured such that linearly aligned bond pads 432 of bond pad connection section 430 are disposed parallel to the slits (for clarity, shown collectively as dotted line 445a), similar to the semiconductor die 10 shown in FIG. 1. As discussed above, the slits can be arranged perpendicular to the bitline connections and/or parallel to the wordline connections. As seen in FIG. 4A, a second bond pad connection section 460 having second bond pads 462 can be disposed on the semiconductor die 410A. Similar to bind pads 232 of semiconductor die 200, the linearly aligned bond pads 462 of bond pad connection section 460 can be disposed perpendicular to the slits (see line 445a). The stack 405 can include two or more semiconductor dies (e.g., semiconductor dies 410A-D as shown in the embodiment of FIG. 4A) that can be stacked in a shingled arrangement in which the offset direction 415 is in-line or parallel with the slits (see line 445a), similar to stack 205 in FIG. 3A. In some embodiments, one or more of the remaining semiconductor dies in the stack 405 (e.g., semiconductor dies 410B-D) can be configured similar to semiconductor die 410A. However, in other embodiments, one or more of the remaining semiconductor dies in stack 405 (e.g., semiconductor dies 410B-D) can be configured similar to semiconductor die 200.

Figure 4B:
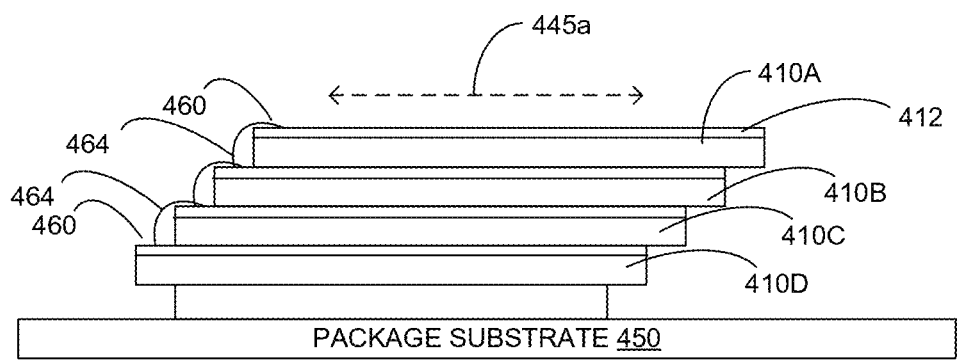
FIG. 4B is a block diagram of a side cross-sectional view of the memory device package of FIG. 4A.
Figure 4C:
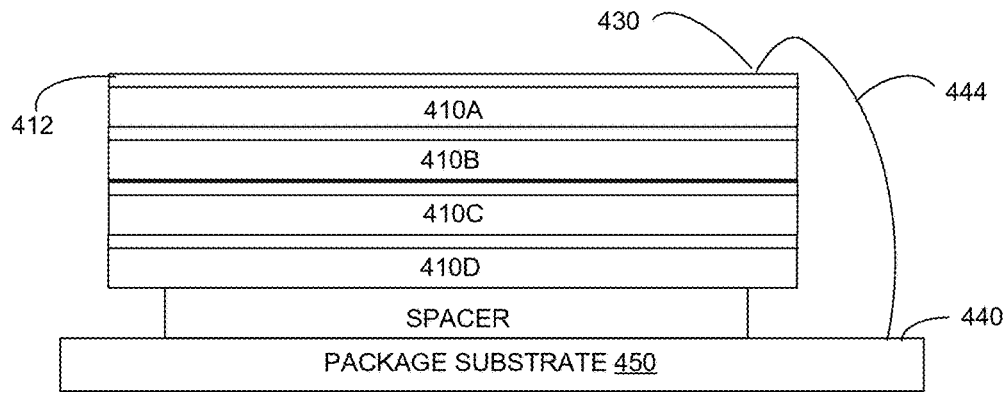
FIG. 4C is a block diagram of a front cross-sectional view of the memory device package of FIG. 4A.

As seen in FIG. 4A, the bond pads 432 on semiconductor die 410A can be connected to the appropriate bond pads 462 via trace lines 465. Wirebonds 464 can be routed between the semiconductor dies 410A to 410D to appropriately connect the respective bond pads 462. As seen in FIG. 4B, the shingled stacking arrangement of stack 405 is similar to that of stack 205 but the wirebond connection to the bondfingers on the package substrate is not done from the bond pads 462. This is because the bondfinger connection section 440 is not located on the side where the bond pad connection 460 is disposed. Instead, as seen in FIG. 4A, the location of the bondfinger connection section 440 is on the bond pad connection 430 side of the package substrate. As seen in FIGS. 4A and 4C, the wirebond 444 can appropriately connect bond pads 432 of semiconductor die 410A (the topmost semiconductor die of stack 405) to the bondfinger 442 of wirebond connection section 440 on the package substrate. Because the bondfinger connection section 440 in this embodiment is located in a same portion of the package substrate as that of related art memory devices, for some components found on the package substrate (e.g., controllers, connections to external devices, etc.), the manufacturing process and configuration techniques used in related art memory devices can be reused for components disposed on package substrate 450.

Figure 4D:
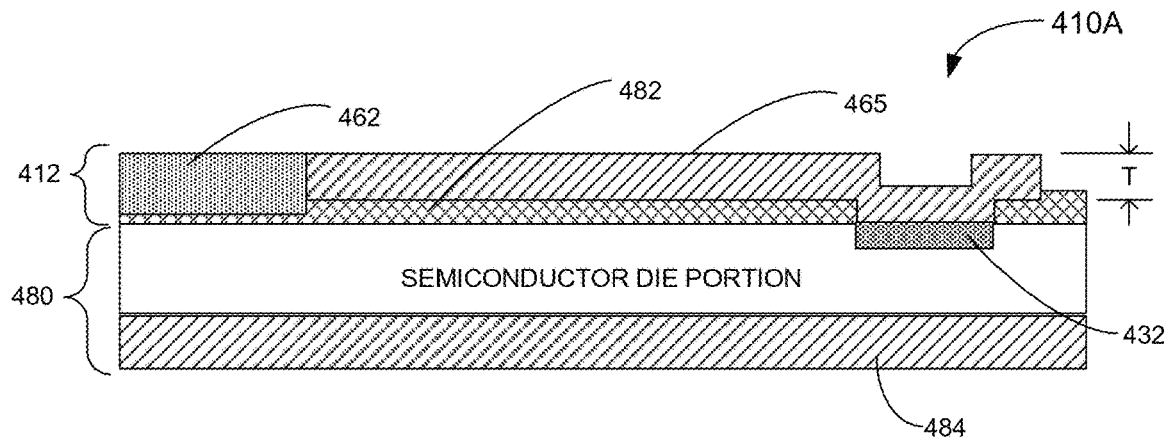
FIG. 4D is a side cross-sectional view of a portion of the semiconductor die used in the memory device package of FIG. 4A.
Figure 4E:
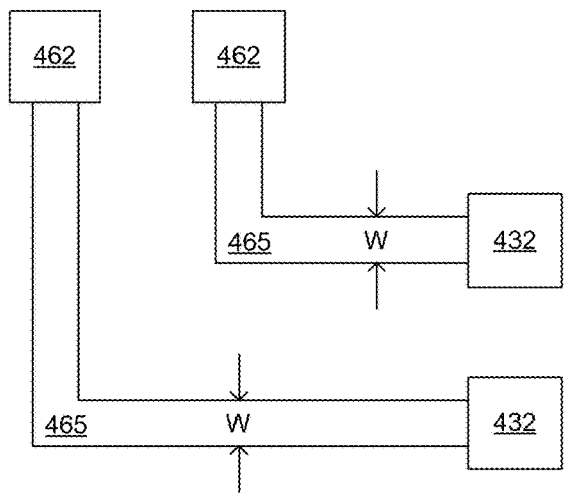
FIG. 4E is a top view of the portion of the trace connections used in the memory device package of FIG. 4A.

In some embodiments, the trace lines 465 for semiconductor die 410A can be formed on a different layer than the base semiconductor die components. For example, as seen in FIG. 4D, a trace connection layer 412 can be formed on top of a semiconductor die portion 480. The semiconductor die portion 480 can have a configuration similar to a typical semiconductor die that has a bond pad connection section located parallel to slit lines of the memory planes. That is, the fabrication of semiconductor die portion 480 can be similar to related art semiconductor dies (e.g., semiconductor die 10), which means that current manufacturing techniques can be reused in fabricating at least a portion of the semiconductor die 410A. However, although the general configuration of the semiconductor die portion 480 can be similar to that of related art semiconductor dies, the substrate 484 of the semiconductor die portion 480 can be thinner than that of related art semiconductor dies due to the shingled offset orientation discussed above. For example, similar to the embodiments discussed above, the thickness of the substrate 484 can be less than 50 μm and, in some cases, less than 40 μm (e.g., in a range of 20 μm to 40 μm, in a range of 30 μm to 40 μm, etc.).

The trace connection layer 412 can include the connections between the bond pads 432 of bond pad connection section 430 and the bond pads 462 of bond pad connection section 460. In some embodiments, the trace connection layer 412 can include an insulating layer 482 such as, for example, a silicon oxide layer, that is formed on a top oxide layer of the semiconductor die portion 480. The insulating layer 482 can be a thin layer having, for example, a thickness of 5 μm or less. The insulating layer 482 can have cutouts for the bond pads 432 located on the semiconductor die 480. Bond pads 462 and trace lines 465 can be formed on top of the insulating layer 482. The trace lines 465 can be routed to connect the bonds pads 462 to the bond pads 432 (see FIG. 4E). The bond pads 462, trace lines 465, and bond pads 432 can be made of an electrically conductive material. For example, the electrically conductive material can be aluminum, aluminum alloy, and/or some other metal or metal alloy.

In some embodiments, the trace connection layer 412 can extend substantially the entire top surface area of the semiconductor die 410A. By extending substantially the entire top surface area, the trace lines 465 can be made wider and thinner than traditional trace lines while ensuring that any resistance drop is minimized. For example, trace line 465 can have a thickness T (see FIG. 4D) that is in a range of 0.5 μm to 1 μm (e.g., in some cases 0.7 μm±1 μm) and a width W (see FIG. 4E) that is 40 μm or greater (e.g., in a range of 40 μm to 100 μm). In some embodiments, the width W to thickness T ratio can be 85 or greater and, in some cases, in a range of 85 to 100.

Although the present invention has been described with reference to the disclosed embodiments, persons skilled in the art will recognize that changes may be made in form and detail without departing from the invention. For example, embodiments of the present disclosure are not limited to the number of stacks and/or the stacking arrangements shown above so long as the bond pads are linearly aligned perpendicular to the slits that separate and define the logic blocks and/or logic sub-blocks of the planes (e.g., the offset direction of the semiconductor dies is in-line with or parallel to the slits). Such modifications are well within the skill of those ordinarily skilled in the art. Accordingly, the invention is not limited except as by the appended claims.

From the foregoing, it will be appreciated that specific embodiments of the technology have been described herein for purposes of illustration, but well-known structures and functions have not been shown or described in detail to avoid unnecessarily obscuring the description of the embodiments of the technology. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the terms "comprising," "including," "having," and "with" are used throughout to mean including at least the recited feature(s) such that any greater number of the same feature and/or additional types of other features are not precluded.

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology as those of ordinary skill in the relevant art will recognize. It will also be appreciated that various modifications may be made without deviating from the disclosure. For example, one of ordinary skill in the art will understand that various components of the technology can be further divided into subcomponents, or that various components and functions of the technology may be combined and integrated. In addition, certain aspects of the technology described in the context of particular embodiments may also be combined or eliminated in other embodiments. Furthermore, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described.

We claim:

1. A semiconductor die, comprising:
   a substrate layer;
   a component layer disposed on the substrate layer, the component layer comprising component blocks that are separated by slits arranged in a first direction; and
   a plurality of bond pads aligned in a second direction that is perpendicular to the first direction,
   wherein the slits extend in a third direction from a top surface of the component layer to the substrate layer.

2. The semiconductor die of claim 1, wherein at least one of the component blocks comprises memory cells.

3. The semiconductor die of claim 1, wherein each slit comprises a dielectric material between corresponding component blocks.

4. The semiconductor die of claim 1, wherein a thickness of the substrate layer is 50 µm or less.

5. The semiconductor die of claim 1, further comprising:
   a plurality of second bond pads aligned in the first direction; and
   a trace connection layer comprising a plurality of traces connecting one or more of the plurality of bond pads with one or more of the plurality of second bond pads.

6. The semiconductor die of claim 5, wherein each trace has a width to thickness ratio that is 85 or greater.

7. The semiconductor die of claim 5, wherein each trace has a thickness that is in a range of 0.5 µm to 1 µm.

8. The semiconductor die of claim 5, wherein each trace has a width that is 40 µm or greater.

9. A semiconductor device, comprising:
   a plurality of semiconductor dies stacked in a shingled arrangement defined by an offset direction, wherein each semiconductor die of the plurality of semiconductor dies comprises:
      a plurality of bond pads aligned perpendicular to the offset direction; and
      slits disposed in a direction parallel to the offset direction, the slits extending from a top of the each semiconductor die to a substrate layer of the each semiconductor die.

10. The semiconductor device of claim 9, wherein each semiconductor die comprises a plurality of component blocks disposed on the substrate layer of the each semiconductor die that are separated by the slits of the each semiconductor die.

11. The semiconductor device of claim 10, wherein at least one of the plurality of component blocks comprises memory cells.

12. The semiconductor device of claim 10, wherein each of the slits comprises a dielectric material between corresponding component blocks.

13. The semiconductor device of claim 10, wherein a respective thickness of the substrate layer of each of the plurality of semiconductor dies is 50 µm or less.

14. The semiconductor device of claim 10, further comprising:
   a plurality of wirebonds, each wirebond connecting a respective bond pad of a first semiconductor die to a respective bond pad of a second semiconductor die.

15. A semiconductor device, comprising:
   a package substrate;
   a plurality of semiconductor dies stacked on the package substrate in a shingled arrangement defined by an offset direction; and
   a plurality of bondfingers disposed on the package substrate, the plurality of bondfingers aligned parallel to the offset direction,
   wherein each semiconductor die of the plurality of semiconductor dies comprises:
      a plurality of first bond pads aligned perpendicular to the offset direction;
      a plurality of second bond pads aligned parallel to the offset direction; and
      a plurality of traces connecting one or more of the plurality of first bond pads with respective one or more of the plurality of second bond pads.

16. The semiconductor device of claim 15, wherein each semiconductor die of the plurality of semiconductor dies comprises slits arranged in a direction parallel to the offset direction, wherein the slits extend from a top of the each semiconductor die to a respective substrate layer of the each semiconductor die.

17. The semiconductor device of claim 16, wherein each semiconductor die comprises component blocks disposed on the respective substrate layer of the each semiconductor die that are separated by the slits of the each semiconductor die.

18. The semiconductor device of claim 15, wherein each trace has a width to thickness ratio that is 85 or greater.

19. The semiconductor device of claim 15, further comprising:
   a plurality of wirebonds, each wirebond connecting a respective first bond pad of a first semiconductor die to a respective first bond pad of a second semiconductor die.

20. The semiconductor device of claim 19, further comprising:
a plurality of second wirebonds, each second wirebond connecting a respective second bond pad on a semiconductor die of the plurality of semiconductor dies to a bondfinger of the package substrate.

\* \* \* \* \*